(12) United States Patent
Jeong

(10) Patent No.: US 11,844,210 B2
(45) Date of Patent: *Dec. 12, 2023

(54) STORAGE DEVICE AND MANUFACTURING METHOD THEREOF

(71) Applicant: WUHAN XINXIN SEMICONDUCTOR MANUFACTURING CO., LTD., Hubei (CN)

(72) Inventor: Jongbae Jeong, Hubei (CN)

(73) Assignee: WUHAN XINXIN SEMICONDUCTOR MANUFACTURING CO., LTD., Hubei (CN)

(*) Notice: Subject to any disclaimer, the term of this patent is extended or adjusted under 35 U.S.C. 154(b) by 0 days.

This patent is subject to a terminal disclaimer.

(21) Appl. No.: 17/542,429

(22) Filed: Dec. 5, 2021

(65) Prior Publication Data

US 2023/0100633 A1    Mar. 30, 2023

(30) Foreign Application Priority Data

Sep. 30, 2021  (CN) .......................... 202111160784.0

(51) Int. Cl.
*G11C 8/10* (2006.01)
*H10B 41/10* (2023.01)
(Continued)

(52) U.S. Cl.
CPC .............. *H10B 41/10* (2023.02); *G11C 7/18* (2013.01); *G11C 8/08* (2013.01); *G11C 8/10* (2013.01); *G11C 8/14* (2013.01); *H10B 43/10* (2023.02)

(58) Field of Classification Search
CPC .... G11C 7/18; G11C 8/08; G11C 8/10; G11C 8/14; H01L 27/11519; H01L 27/11565
See application file for complete search history.

(56) References Cited

U.S. PATENT DOCUMENTS 8,526,251 B2 * 9/2013 Park ........................ G11C 7/222
                                                      365/194
8,542,546 B2 * 9/2013 Matsui ................... G11C 29/48
                                                      365/201
(Continued)

FOREIGN PATENT DOCUMENTS

TW           201903765 A      1/2019
TW           201921631 A      6/2019

OTHER PUBLICATIONS

Taiwan Office Action issued in corresponding Patent Application No. 201911323228.3 dated Jun. 13, 2022, pp. 1-8.

*Primary Examiner* — Khamdan N. Alrobaie
(74) *Attorney, Agent, or Firm* — Mark M. Friedman

(57) ABSTRACT

A storage device and a manufacturing method thereof are provided and relate to the technology field of storage. The storage device includes storage a first chip and a second chip. The first chip includes a storage array. The storage array includes at least one storage block. The second chip includes a logic control circuit. The logic control circuit includes a global bit line decoder. The global bit line decoder is electrically connected to the at least one storage block. An occupied area after the first chip and the second chip are stacked can be reduced by constructing the global bit line decoder block constituted by the global bit line decoder in the top view projection area of the second chip, thereby reducing plane occupied space of the storage device. This is beneficial for minimizing the size of the storage device.

20 Claims, 5 Drawing Sheets

(51) Int. Cl.
*H10B 43/10* (2023.01)
*G11C 7/18* (2006.01)
*G11C 8/08* (2006.01)
*G11C 8/14* (2006.01)

(56) References Cited

U.S. PATENT DOCUMENTS

| | | | |
|---|---|---|---|
| 9,042,192 B2* | 5/2015 | Jeon | G11C 29/26 |
| | | | 365/201 |
| 9,368,167 B2* | 6/2016 | Park | G11C 29/022 |
| 11,227,648 B2 | 1/2022 | Bedeschi | |
| 2009/0129136 A1* | 5/2009 | Takemura | H01L 27/10814 |
| | | | 365/230.03 |
| 2021/0074342 A1* | 3/2021 | Tsuji | G11C 7/1006 |
| 2022/0101899 A1 | 3/2022 | Dodge | |

* cited by examiner

STORAGE DEVICE AND MANUFACTURING METHOD THEREOF

TECHNICAL FIELD

The present disclosure relates to the technology field of storage, and more particularly to a storage device and a manufacturing method thereof.

BACKGROUND

As shown in FIG. 1, a storage device in a conventional technical solution includes a plurality of storage blocks 510, a plurality of local bit line decoders 520, a plurality of word line decoders 540, a plurality of global bit line decoders 530, and other circuits 550. Structure areas of the storage blocks 510, structure areas of the local bit line decoders 520, structure areas of the word line decoders 540, structure areas of the global bit line decoders 530, and a structure area of the other circuits 550 do not overlapped with each other. For example, each of the structure areas of the local bit line decoders 520 is located at one side of a corresponding one of the structure areas of the storage blocks 510, each of the word line decoders 540 is located at one side of a corresponding one of the structure areas of the word line decoders 540 and/or at another side of a corresponding one of the structure areas of the storage blocks 510, and each of the structure areas of the global bit line decoders 530 is located between a corresponding one of the structure areas of the local bit line decoders 520 and the structure area of the peripheral circuit area 550.

Specifically, as shown in FIG. 2, in a certain direction, the storage blocks 510 and the local bit line decoders 520 are arranged alternately and sequentially, and a last one of the local bit line decoders 520 is followed by a corresponding one of the global bit line decoders 530 and a plurality of sense amplifiers 551. A corresponding one of the word line decoders 540 is disposed at one side of each of the storage blocks 510. Each of the local bit line decoders 520 is electrically connected to a corresponding one of the storage block 510 and a corresponding one of the global bit line decoders 530. Output terminals of each of the global bit line decoders 530 are electrically connected to a plurality of corresponding sense amplifiers 551. Similarly, the structure area of each of the storage blocks 510, the structure area of each of the local bit line decoders 520, the structure area of the global bit line decoder 530, the structure area of each of the sense amplifiers 551, and the structure area of each of the word line encoder 540 do not overlap with each other, either.

Accordingly, the storage device in the above-mentioned conventional technical solution needs to occupy a large space to integrate the structures of the above-mentioned parts, and this is not beneficial for minimizing the size of the storage device.

It should be noted that the above-mentioned introduction of the background technology is only to facilitate a clear and complete understanding of the technical solutions of the present disclosure. Therefore, it cannot be considered that the above-mentioned related technical solutions are known to those skilled in the art just because they appear in the background technology of the present disclosure.

SUMMARY OF DISCLOSURE

The present disclosure provides a storage device and a manufacturing method thereof alleviate the technical problem that the storage device needs to occupy large space.

In a first aspect, the present disclosure provides a storage device including a first chip and a second chip. The first chip includes a storage array, the storage array includes at least one storage block, and the storage block includes a plurality of word lines extending in a first direction and a plurality of bit lines extending in a second direction. The second chip is stacked on the first chip in a third direction. The second chip has a top view projection area corresponding to the storage block, the second chip includes a logic control circuit, the logic control circuit includes a global bit line decoder, the global bit line decoder is electrically connected to the at least one storage block, and a global bit line decoder block constituted by the global bit line decoder being located in the top view projection area.

In some embodiments, the logic control circuit further includes a local bit line decoder. The local bit line decoder includes a first local bit line sub-decoder, the first local bit line sub-decoder is electrically connected to the storage block and the global bit line decoder, and a first local bit line sub-decoder block constituted by the first local bit line sub-decoder is located in the top view projection area. In the first direction, a projection of the first local bit line sub-decoder block and a projection of the global bit line decoder block do not overlap with each other.

In some embodiments, the first local bit line sub-decoding unit includes a first local bit line sub-decoding unit and a second local bit line sub-decoding unit. The first local bit line sub-decoding unit is electrically connected to a part of the bit lines and the global bit line decoder, and the second local bit line sub-decoding unit is electrically connected to the other part of the bit lines and the global bit line decoder. In the direction, a projection of a first local bit line sub-decoding unit block constituted by the first local bit line sub-decoding unit and a projection of a second local bit line sub-decoding unit block constituted by the second local bit line sub-decoding unit do not overlap with each other. In the second direction, the global bit line decoder block is located between the first local bit line sub-decoding unit block and the second local bit line sub-decoding unit block.

In some embodiments, in the first direction, a length of the global bit line decoder block, a length of the first local bit line sub-decoding unit block, and a length of the second local bit line sub-decoding unit block are smaller than or equal to a length of the top view projection area. In the second direction, a sum of a width of the global bit line decoder block, a width of the first local bit line sub-decoding unit block, and a width of the second local bit line sub-decoding unit block is smaller than or equal to a width of the top view projection area.

In some embodiments, the logic control circuit further includes a word line decoding circuit. The word line decoding circuit includes a first word line sub-decoder, the first word line sub-decoder is electrically connected to the word lines, and a first word line sub-decoder block constituted by the first word line sub-decoder is located in the top view projection area. In the second direction, the first word line sub-decoder block is located between the global bit line decoder block and the first local bit line sub-decoding unit block.

In some embodiments, the first word line sub-decoder includes a first word line decoding unit and a second word line decoding unit. The first word line decoding unit is electrically connected to a part of the word lines, and the second word line decoding unit is electrically connected to the other part of the word lines. In the first direction, a projection of the first word line decoding unit block constituted by the first word line decoding unit at least partially overlaps with a projection of a second word line decoding unit block constituted by the second word line decoding unit. In the second direction, the projection of the first word line decoding unit block and the projection of the second word line decoding unit block do not overlap with each other.

In some embodiments, the logic control circuit further includes a sense amplifying circuit electrically connected to the global bit line decoder, and a sense amplifying circuit block constituted by the sense amplifying circuit located in the top view projection area. In the first direction, the sense amplifier circuit block is located between the first word line decoding unit block and the second word line decoding unit block. In the second direction, the sense amplifier circuit block is located between the global bit line decoder block and the second local bit line sub-decoding unit block.

In some embodiments, the sense amplifying circuit includes a first group of sense amplifiers and a second group of sense amplifiers. The first group of sense amplifiers are electrically connected to the global bit line decoder, and the first group of sense amplifiers include a plurality of sense amplifiers arranged sequentially in the first direction. The second group of sense amplifiers are electrically connected to the global bit line decoder, and the second group of sense amplifiers include a plurality of sense amplifiers arranged sequentially in the first direction. In the first direction, projections of a first group of sense amplifier blocks constituted by the first group of sense amplifiers and projections of second group of sense amplifier blocks constituted by the second group of sense amplifiers at least partially overlap with each other. In the second direction, the projections of the first group of sense amplifier blocks and the projections of the second group of sense amplifier blocks do not overlap with each other.

In some embodiments, in the first direction, the first word line decoding unit block, the first group of sense amplifier blocks, the second group of sense amplifier blocks, and the second word line decoding unit block are arranged sequentially. In the first direction, a distance between the first group of sense amplifier blocks and the first word line decoding unit block is smaller than a distance between the first group of sense amplifier blocks and the second word line decoding unit block, and a distance between the second group of sense amplifier blocks and the first word line decoding unit block is greater than a distance between the second group of sense amplifier blocks and the second word line decoding unit block.

In some embodiments, in the first direction, the projections of the first group of sense amplifier blocks and at least one of the projection of the first word line decoding unit block and the projection of the second word line decoding unit block coincide with each other, and the projections of the second group of sense amplifier blocks and at least one of the projection of the first word line decoding unit block and the projection of the second word line decoding unit block coincide with each other.

In some embodiments, the logic control circuit further includes a plurality of first wirings, and the first wirings are electrically connected to output terminals of the global bit line decoder and input terminals of the sense amplifiers. In the second direction, the first wirings are located between the global bit line decoder block and the sense amplifier circuit block, and the first wirings are arranged sequentially in the first direction.

In some embodiments, the logic control circuit further includes a plurality of second wirings, and the second wirings are electrically connected to input terminals of the global bit line decoder and output terminals of the local bit line decoder. In the first direction, the second wirings are arranged sequentially, and the second wirings are located in the top view projection area.

In some embodiments, each of the first local bit line sub-decoding unit and the second local bit line sub-decoding unit has a plurality of first transmission terminals, and each of the first transmission terminals is electrically connected to one of the bit lines through a first silicon via or a pair of first bonding pads.

In some embodiments, each of the first word line decoding unit and the second word line decoding unit has a plurality of second transmission terminals, and each of the second transmission terminals is electrically connected to a second silicon via or a pair of second transmission bonding pads.

In some embodiments, the at least one storage block includes a first storage block to an Nth storage block sequentially arranged in the second direction. When N is an odd number, the global bit line decoder block is located in a top view projection area of a (N+1)/2 storage block in the second chip. When N is an even number, the global bit line decoder block is located in a top view projection area of a (N/2)th storage block in the second chip or in a top view projection area of a (1+N/2)th storage block in the second chip. N is an integer greater than or equal to 1.

In a second aspect, the present disclosure provides a manufacturing method of a storage device including: configuring a storage array on a first chip, wherein the storage array includes at least one storage block, and the storage block includes a plurality of word lines extending in a first direction and a plurality of bit lines extending in a second direction; configuring a logic control circuit on a second chip, wherein the second chip has a top view projection area corresponding to the at least one storage block, the logic control circuit includes a global bit line decoder electrically connected to the at least one storage block, and a global bit line decoder block constituted by the global bit line decoder is located in the top view projection area; and stacking the second chip on the first chip in a third direction.

In some embodiments, the manufacturing method further includes: configuring a local bit line decoder in the logic control circuit, wherein the local bit line decoder includes a first local bit line sub-decoder; electrically connecting the first local bit line sub-decoder with the bit lines and the global bit line decoder; and configuring a first local bit line sub-decoder block constituted by the first local bit line sub-decoder to be located in the top view projection area, wherein in the first direction, a projection of the first local bit line sub-decoder block and a projection of the global bit line decoder block do not overlap with each other.

In some embodiments, the manufacturing method further includes: configuring the first local bit line sub-decoder to include a first local bit line sub-decoding unit and a second local bit line sub-decoding unit; electrically connecting the first local bit line sub-decoding unit with a part of the bit lines and the global bit line decoder, and electrically connecting the second local bit line sub-decoding unit with the other part of the bit lines and the global bit line decoder; and configuring a first local bit line sub-decoding unit block constituted by the first local bit line sub-decoding unit and a second local bit line sub-decoding unit block constituted by the second local bit line sub-decoding unit in the top view projection area; wherein in the first direction, a projection of the first local bit line sub-decoding unit block and a projection of the second local bit line sub-decoding unit block do not overlap with each other; and in the second direction, the global bit line decoder block is located between the first local bit line sub-decoding unit block and the second local bit line sub-decoding unit block.

In some embodiments, the manufacturing method further includes: configuring a word line decoding circuit in the logic control circuit, wherein the word line decoding circuit includes a first word line sub-decoder; electrically connecting the first word line sub-decoder with the word lines; and configuring a first word line sub-decoder block constituted by the first word line sub-decoder in the top view projection area; wherein in the second direction, the first word line sub-decoder block is located between the global bit line decoder block and the first local bit line sub-decoding unit block.

In some embodiments, the manufacturing method further includes: configuring the first word line sub-decoder to include a first word line decoding unit and a second word line decoding unit; electrically connecting the first word line decoding unit with a part of the word lines, and electrically connecting the second word line decoding unit with the other part of the word lines; and configuring a projection of the first word line decoding unit block constituted by the first word line decoding unit block and a projection of the second word line decoding unit block constituted by the second word line decoding units to at least partially overlap in the first direction, wherein the projection of the first word line decoding unit block and the projection of the second word line decoding unit block do not overlap with each other in the second direction.

In the storage device and the manufacturing method thereof provided by the present disclosure, an occupied area after the first chip and the second chip are stacked can be reduced by constructing the global bit line decoder block constituted by the global bit line decoder in the top view projection area of the second chip, thereby reducing plane occupied space of the storage device. This is beneficial for minimizing the size of the storage device.

Since the decoders are totally disposed in the projection range and the two chips are formed as a stacked structure, the decoders can be vertically connected to the storage array without extra without additional horizontal wiring connections. Therefore, there is no need to reserve wiring space between the two sub-modules. The areas of the first chip and the second chip can be further reduced.

BRIEF DESCRIPTION OF DRAWINGS

The technical solution and the beneficial effects of the present disclosure are best understood from the following detailed descriptions with reference to the accompanying drawings and embodiments.

DETAILED DESCRIPTION OF EMBODIMENTS

Figure 1:
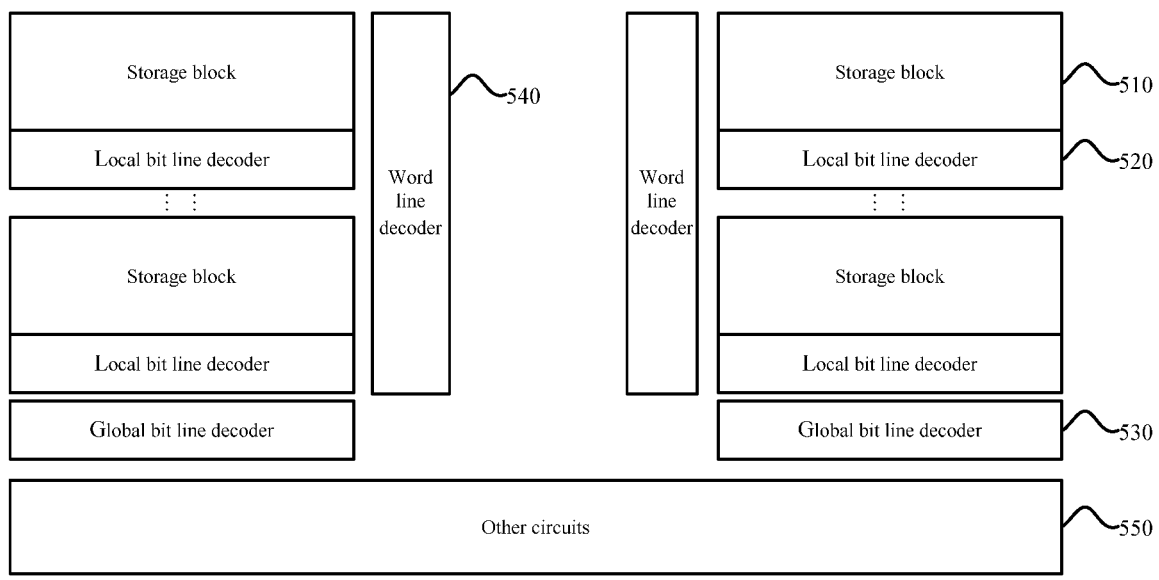
FIG. 1 illustrates an arrangement diagram of various element structures in a storage device block provided by a conventional technical solution.
Figure 2:
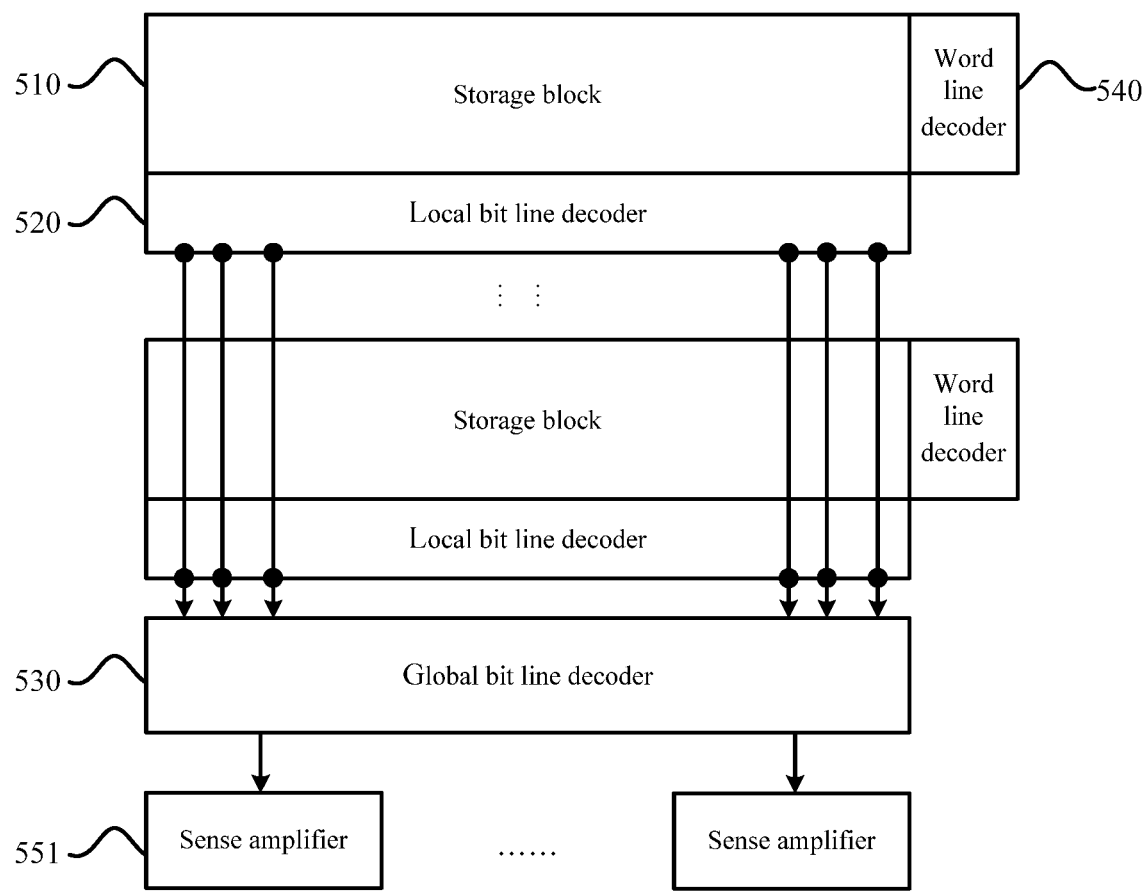
FIG. 2 illustrates another arrangement diagram of various element structures in a storage device block provided by a conventional technical solution.

The following clearly and completely describes the technical solutions in the embodiments of the present disclosure with reference to the accompanying drawings in the embodiments of the present disclosure. The described embodiments are some rather than all of the embodiments of the present disclosure. All other embodiments obtained by those skilled in the art based on the embodiments of the present disclosure without creative efforts shall fall within the protection scope of the present disclosure.

In the descriptions of the present disclosure, word line decoders are also described as X-DECs, and bit line decoders are also described as a bit line selector, a bit line multiplexer, or a Y-MUX. The word line decoders and the bit line decoders are configured to position a plurality of storage units in a storage array for further performing reading and writing operations on the storage units.

In the descriptions of the present disclosure, it should be understood that orientations or position relationships indicated by the terms "center", "longitudinal", "lateral", "length", "width", "thickness", "upper", "lower", "front", "rear", "left", "right", "vertical", "horizontal", "top", "bottom", "inside", "outside", "clockwise", and "counter-clockwise" are based on orientations or position relationships illustrated in the drawings. The terms are used to facilitate and simplify the descriptions of the present disclosure, rather than indicate or imply that the devices or elements referred to herein is required to have specific orientations or be constructed or operates in the specific orientations. Accordingly, the terms should not be construed as limiting the present disclosure. Furthermore, the terms "first" and "second" are for descriptive purposes only and should not be construed as indicating or implying relative importance or implying the number of technical features. As such, the features defined by the term "first" and "second" may include one or more of the features explicitly or implicitly. In the descriptions of the present disclosure, the term "more" refers two or more than two, unless otherwise specifically defined.

In the descriptions of the present disclosure, it should be noted that unless otherwise clearly defined and limited, the terms "mounted", "connected/coupled", and "connection" should be interoperated broadly. For example, the terms may refer to a fixed connection, a detachable connection, or an integral connection; the terms may also refer to a mechanical connection, an electrical connection, or communication with each other; the terms may further refer to a direct connection, an indirect connection through an intermediary, or an interconnection between two elements or interactive relationship between two elements. Those skilled in the art can understand the specific meanings of the above-mentioned terms in the present disclosure according to circumstances.

In the present disclosure, it should be noted that unless otherwise clearly defined and limited, a first feature "on" or "under" a second feature may mean that the first feature directly contacts the second feature, or that the first feature contacts the second feature via an additional feature there between instead of directly contacting the second feature. Moreover, the first feature "on", "above", and "over" the second feature may mean that the first feature is right over or obliquely upward over the second feature or mean that the first feature has a horizontal height higher than that of the second feature. The first feature "under", "below", and "beneath" the second feature may mean that the first feature is right beneath or obliquely downward beneath the second feature or mean that that horizontal height of the first feature is lower than that of the second feature.

Please refer to FIGS. 3 to 6. An embodiment of the present disclosure a storage device which includes a first chip 100 and a second chip 200. The first chip 100 includes a storage array 10. The storage array 10 includes at least one storage block, such as a first storage block 11, a second storage block 12, . . . , and an Nth storage block 13. Each of the at least one storage block includes a plurality of word lines extending in a first direction DR1 and a plurality of bit lines extending in a second direction DR2. The second chip 200 is stacked on the first chip 100 in a third direction DR3. The second chip 200 has a top view projection area corresponding to the storage block. The second chip 200 includes a logic control circuit. The logic control circuit includes a global bit line decoder 20. The global bit line decoder 20 is electrically connected to the at least one storage block, and a global bit line decoder block constituted by the global bit line decoder 20 is located in the top view projection area.

It can be understood that in the storage device provided by the present embodiment, an occupied area after the first chip 100 and the second chip 200 are stacked can be reduced by constructing the global bit line decoder block constituted by the global bit line decoder 20 in the top view projection area of the second chip, thereby reducing plane occupied space of the storage device. This is beneficial for minimizing the size of the storage device. Moreover, this stacked structure is beneficial for decreasing a wiring distance between the logic control circuit and a storage unit.

The first chip 100 can be a wafer, and the second chip can be another wafer.

It should be noted that each block in the present disclosure can be understood as required wafer space to construct a corresponding structure. For example, the top view projection area can be understood as occupied space to construct the storage block. That is, the top view projection area is constituted by the storage block. For another example, the global bit line decoder block can also be understood as required occupied space to construct the global bit line decoder 20. That is, the global bit line decoder block is constituted by the global bit line decoder 20.

In addition, the storage block in the present embodiment can be used as an independent element, which can be any one of the at least one storage block. For example, the storage block can be the first storage block 11, the second storage block 12, or the Nth storage block 13. N can be a positive integer.

Accordingly, in the present embodiment, the global bit line decoder block constituted by the global bit line decoder 20 can partially or completely overlap with a structure area of any one of the least one storage block. As such, an occupied area after the first chip 100 and the second chip 200 are stacked can be reduced, thereby reducing occupied space of the storage device. This is beneficial for minimizing the size of the storage device.

In one embodiment, in the first direction DR1, a length of the top view projection area is larger than or equal to a length of the global bit line decoder block. It can be understood that this can maximize an overlapping area between the top view projection area and the global bit line decoder block. The first direction can be a bit line arrangement direction of the storage array 10.

In one embodiment, in the second direction DR2, a width of the top view projection area is larger than a width of the global bit line decoder block. It can be understood that this can further increase the overlapping area between the top view projection area and the global bit line decoder block. The second direction can a word line arrangement direction of the storage array 10.

In one embodiment, the logic control circuit further includes a local bit line decoder 30. The local bit line decoder 30 includes a first local bit line sub-decoder 30A.

The first local bit line sub-decoder 30A is electrically connected to the storage block and the global bit line decoder 20. A first local bit line sub-decoder block constituted by the first local bit line sub-decoder 30A is located in the top view projection area. In the first direction DR1, a projection of the first local bit line sub-decoder block and a projection of the global bit line decoder block do not overlap with each other.

It can be understood that an occupied area after the first chip 100 and the second chip 200 are stacked can be further reduced by partially overlapping the top view projection area with the first local bit line sub-decoder block, thereby reducing occupied space of the storage device. This is beneficial for minimizing the size of the storage device.

In the present disclosure, the first direction DR1 can also be an abscissa direction, the second direction DR2 can also be an ordinate direction, and the third direction DR3 can also be a thickness direction of the storage device.

It should be noted that in the present embodiment, each storage block is provided with a local bit line sub-decoder, and each storage block includes corresponding bit lines. The local bit line sub-decoder is connected to the bit lines of a corresponding storage and can be configured to control the corresponding bit lines to be in a turn-on state or a turn-off state simultaneously or in a time-sharing manner.

For example, the first storage block 11 is provided with the first local bit line sub-decoder 30A, the second storage block 12 is provided with a second local bit line sub-decoder 30B, and the Nth storage block 13 is provided with an Nth local bit line decoder 30C.

In one embodiment, the first local bit line sub-decoding unit 30A includes a first local bit line sub-decoding unit 31 and a second local bit line sub-decoding unit 32. The first local bit line sub-decoding unit 31 is electrically connected to a part of the bit lines and the global bit line decoder 20. The second local bit line sub-decoding unit 32 is electrically connected to the other part of the bit lines and the global bit line decoder 20. In the direction DR1, a projection of a first local bit line sub-decoding unit block constituted by the first local bit line sub-decoding unit 31 and a projection of a second local bit line sub-decoding unit block constituted by the second local bit line sub-decoding unit 32 do not overlap with each other. In the second direction DR2, the global bit line decoder block is located between the first local bit line sub-decoding unit block and the second local bit line sub-decoding unit block.

The first local bit line sub-decoding unit block can be a block constituted by any one of the first local bit line sub-decoding unit 31, a third local bit line sub-decoding unit 33, and a (2N−1)th local bit line sub-decoding unit 35. The second local bit line sub-decoding unit block can be a block constituted by any one of the second local bit line sub-decoding unit 32, a fourth local bit line sub-decoding unit 34, and a 2Nth local bit line sub-decoding unit 36.

It should be noted that in the present embodiment, the first local bit line sub-decoder 30A can be divided into the first local bit line sub-decoding unit 31 and the second local bit line sub-decoding unit 32. It is beneficial for achieving minimization of each of the local bit line sub-decoders, and fragmented areas of the second chip 200 can be used fully, thereby minimizing the area of the second chip 200. Meantime, this division is more beneficial to layout of a word line decoder. The word line decoder can also be arranged in the projection range without affecting the wirings, thereby further saving the area.

Similarly, the second local bit line sub-decoder 30B configured in the second storage block 12 can also be divided into the third local bit line sub-decoding unit 33 and the fourth local bit line sub-decoding unit 34, so that the third local bit line sub-decoding unit 33 and the fourth local bit line sub-decoding unit 34 can be disposed at different locations. The Nth local bit line sub-decoder 30C configured in the third storage block 12 can also be divided into the (2N-1)th local bit line sub-decoding unit 35 and the 2Nth local bit line sub-decoding unit 36, so that the (2N-1)th local bit line sub-decoding unit 35 and the 2Nth local bit line sub-decoding unit 36 can be disposed at different locations.

In one embodiment, the global bit line decoder block can be adjacent to the first local bit line sub-decoding unit block and away from the second local bit line sub-decoding unit block.

In one embodiment, the top view projection area or each block can have a specific shape, for example, a rectangle, a square, a circle, an ellipse and so on.

In some embodiments, in the first direction DR1, a length of the global bit line decoder block, a length of the first local bit line sub-decoding unit block, and a length of the second local bit line sub-decoding unit block are smaller than or equal to a length of the top view projection area. In the second direction DR2, a sum of a width of the global bit line decoder block, a width of the first local bit line sub-decoding unit block, and a width of the second local bit line sub-decoding unit block is smaller than or equal to a width of the top view projection area.

In one embodiment, the logic control circuit further includes a word line decoding circuit 40, and the word line decoding circuit 40 includes a first word line sub-decoder 40A. The first word line sub-decoder 40A is electrically connected to the word lines. A first word line sub-decoder block constituted by the first word line sub-decoder 40A is located in the top view projection area. In the second direction DR2, the first word line sub-decoder block is located between the global bit line decoder block and the first local bit line sub-decoding unit block.

It can be understood that an occupied area after the first chip 100 and the second chip 200 are stacked can be further reduced by partially overlapping the top view projection area with the first word line sub-decoder block constituted by the first word line sub-decoder 40A, thereby reducing occupied space of the storage device. This is beneficial for minimizing the size of the storage device.

It should be noted that in the present embodiment, each storage block is provided with a word line sub-decoder, and each storage block includes corresponding word lines. The word line sub-decoder is electrically connected to the word lines of a corresponding storage.

For example, the first storage block 11 is provided with the first word line sub-decoder 40A, the second storage block 12 is provided with a second word line sub-decoder 40B, and the N-th storage block 13 is provided with an N-th word line sub-decoder 40C.

In one embodiment, the first word line sub-decoder 40A includes a first word line decoding unit 41 and a second word line decoding unit 42. The first word line decoding unit 41 is electrically connected to a part of the word lines, and the second word line decoding unit 42 is electrically connected to the other part of the word lines. In the first direction DR1, a projection of the first word line decoding unit block constituted by the first word line decoding unit 41 at least partially overlaps with a projection of a second word line decoding unit block constituted by the second word line decoding unit 42. In the second direction DR2, the projection of the first word line decoding unit block and the projection of the second word line decoding unit block do not overlap with each other.

It should be noted that in the present embodiment, the first word line sub-decoder 40A can be divided into the first word line decoding unit 41 and the second word line decoding unit 42. It is beneficial for achieving minimization of each of the word line sub-decoders, and fragmented areas of the second chip 200 can be used fully, thereby minimizing the area of the second chip 200.

Similarly, the second word line sub-decoder 40B configured in the second storage block 12 can also be divided into a third word line decoding unit 43 and a fourth word line decoding unit 44, so that the third word line decoding unit 43 and the fourth word line decoding unit 44 can be disposed at different locations. The Nth word line sub-decoder 40C configured in the Nth storage block 12 can also be divided into a (2N-1)th word line decoding unit 45 and a 2Nth word line decoding unit 434, so that the (2N-1)th word line decoding unit 45 and the 2Nth word line decoding unit 46 can be disposed at different locations.

In one embodiment, the logic control circuit further includes a sense amplifying circuit 50. The sense amplifying circuit 50 is electrically connected to the global bit line decoder 20. A sense amplifying circuit block constituted by the sense amplifying circuit 50 is located in the top view projection area. In the first direction DR1, the sense amplifier circuit block is located between the first word line decoding unit block and the second word line decoding unit block. In the second direction DR2, the sense amplifier circuit block is located between the global bit line decoder block and the second local bit line sub-decoding unit block.

It can be understood that an occupied area after the first chip 100 and the second chip 200 are stacked can be further reduced by partially overlapping the top view projection area with the sense amplifier circuit block constituted by the sense amplifying circuit 50, thereby reducing occupied space of the storage device. This is beneficial for minimizing the size of the storage device.

Figure 3:
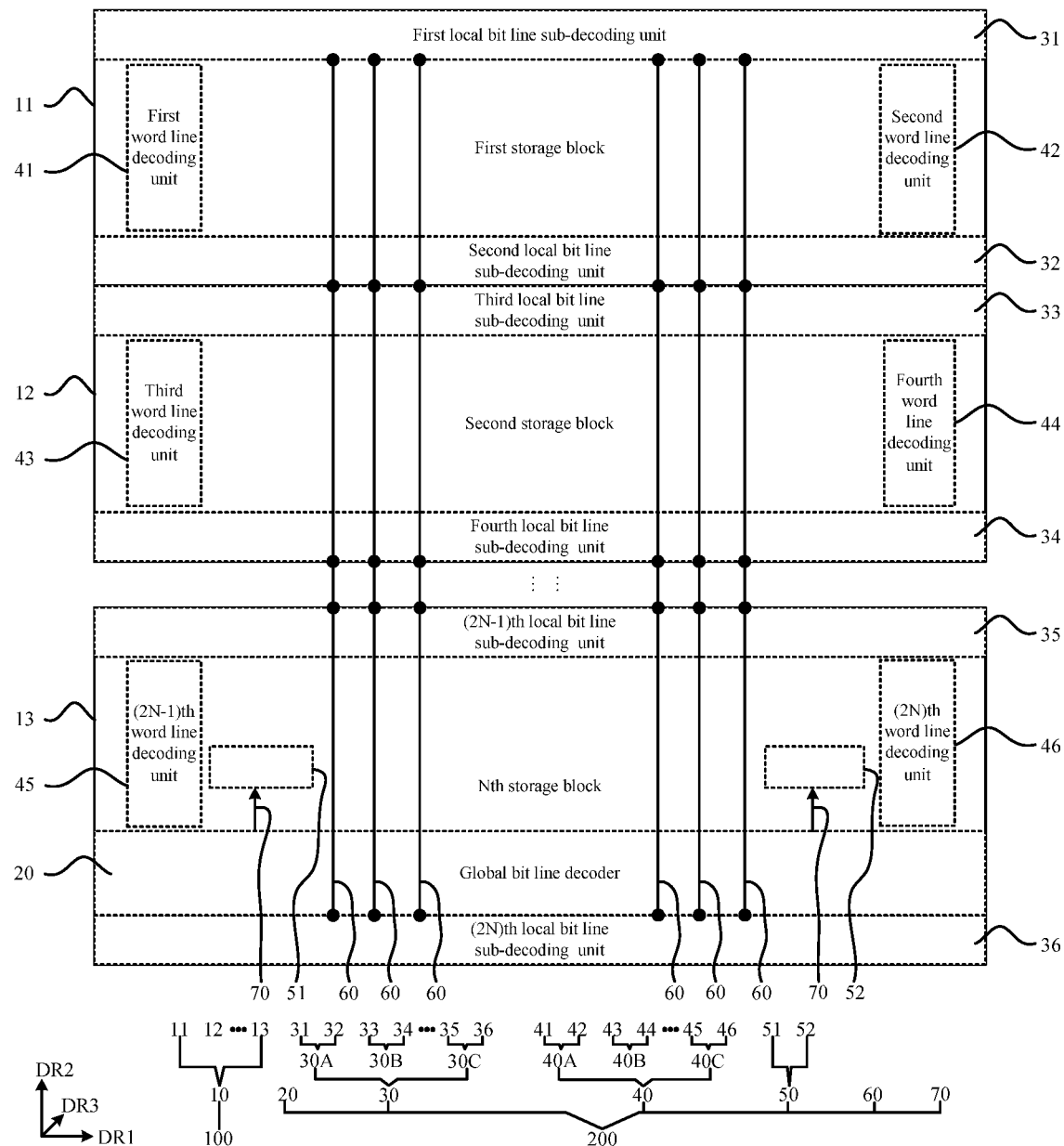
FIG. 3 illustrates a first structure diagram of a storage device provided by an embodiment of the present disclosure.
Figure 4:
FIG. 4 illustrates a structure diagram of a sense amplifying circuit in FIG. 3.

As shown in FIGS. 3 and 4, in one embodiment, the sense amplifying circuit 50 includes a first group of sense amplifiers 51 and a second group of sense amplifiers 52. The first group of sense amplifiers 51 are electrically connected to the global bit line decoder 20. The first group of sense amplifiers 51 include a plurality of sense amplifiers arranged sequentially in the first direction DR1, such as a sense amplifier 51A, a sense amplifier 51B, a sense amplifier 51C, a sense amplifier 51D and so on. The second group of sense amplifiers 52 are electrically connected to the global bit line decoder 20. The second group of sense amplifiers 52 include a plurality of sense amplifiers arranged sequentially in the first direction DR1, such as a sense amplifier 52A, a sense amplifier 52B, a sense amplifier 52C, and a sense amplifier 52D and so on. In the first direction DR1, projections of a first group of sense amplifier blocks constituted by the first group of sense amplifiers 51 and projections of second group of sense amplifier blocks constituted by the second group of sense amplifiers 52 at least partially overlap with each other. In the second direction DR2, the projections of the first group of sense amplifier blocks and the projections of the second group of sense amplifier blocks do not overlap with each other.

In one embodiment, in the first direction DR1, the first word line decoding unit block, the first group of sense amplifier blocks, the second group of sense amplifier blocks, and the second word line decoding unit block are arranged sequentially. In the first direction DR1, a distance between the first group of sense amplifier blocks and the first word line decoding unit block is smaller than a distance between the first group of sense amplifier blocks and the second word line decoding unit block, and a distance between the second group of sense amplifier blocks and the first word line decoding unit block is greater than a distance between the second group of sense amplifier blocks and the second word line decoding unit block.

In one embodiment, in the first direction DR1, the projections of the first group of sense amplifier blocks and at least one of the projection of the first word line decoding unit block and the projection of the second word line decoding unit block coincide with each other, and the projections of the second group of sense amplifier blocks and at least one of the projection of the first word line decoding unit block and the projection of the second word line decoding unit block coincide with each other.

In one embodiment, the logic control circuit further includes a plurality of first wirings 70, and the first wirings 70 are electrically connected to output terminals of the global bit line decoder 20 and input terminals of the sense amplifiers. In the second direction DR2, the first wirings 70 are located between the global bit line decoder block and the sense amplifier circuit block, and the first wirings 70 are arranged sequentially in the first direction DR1.

It should be noted that the first wirings 70 can be located in the same wafer layer as the logic control circuit. It can be avoided that when the first wirings need to occupy another wafer layer, the required thickness of the second chip 200 is increased.

In one embodiment, the logic control circuit further includes a plurality of second wirings 60, and the second wirings 60 are electrically connected to input terminals of the global bit line decoder 20 and output terminals of the local bit line decoder 30. In the first direction DR1, the second wirings 60 are arranged sequentially, and the second wirings 60 are located in at least one top view projection area. It can be understood that one storage block can correspondingly form a top view projection area.

It should be noted that the second wirings 60 can be located on a wafer layer different from the layer of the logic control circuit to achieve partial stacking of the second wirings 60 and the logic control circuit, thereby saving the required area of the second chip 200.

The second wirings 60 can be global bit lines.

Figure 5:
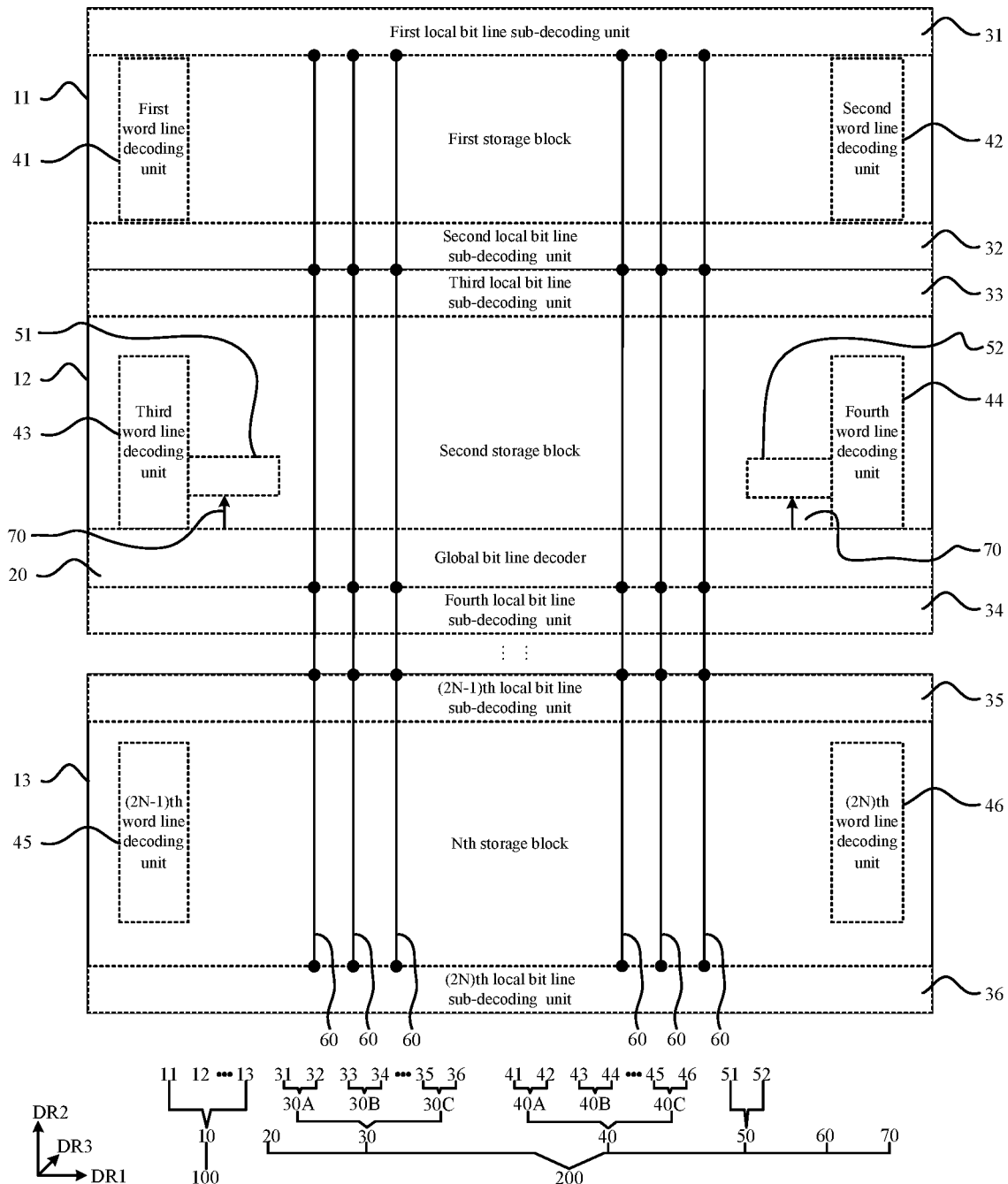
FIG. 5 illustrates another structure diagram of a storage device provided by an embodiment of the present disclosure.

In one embodiment, it should be explained that the difference between the structure diagram shown in FIG. 3 and the structure diagram shown in FIG. 5 is that structure areas of the global bit line decoder 20, the sense amplifying circuit 50, and the first wirings 70 overlap with the structure area of the Nth storage block 13 in FIG. 3, and structure areas of the global bit line decoder 20, the sense amplifying circuit 50, and the first wirings 70 overlap or coincide with the structure area of the second storage block 12 in FIG. 5. Meantime, in the two different arrangements, positions of connecting nodes of the second wirings 60, each local bit line sub-decoder, and the global bit line decoder 20 and wiring paths of the second wirings 60 are also required to be correspondingly changed.

In one embodiment, the at least one storage block includes the first storage block 11 to the Nth storage block 13 sequentially arranged in the second direction DR2. When N is an odd number, the global bit line decoder block is located in a top view projection area of a (N+1)/2 storage block in the second chip 200. When N is an even number, the global bit line decoder block is located in a top view projection area of a (N/2)th storage block in the second chip 200 or in a top view projection area of a (1+N/2)th storage block in the second chip 200. N is an integer greater than or equal to 1. It can be understood that the global bit line decoder block can be disposed in the middle position of the storage array 10 in such an arrangement.

In summary, the global bit line decoder block can be located in any one top down projection area. When the global decoder block is located in a top down projection area of a middle storage block, a total distance between the global decoder block and the local bit line decoder can be reduced. As such, the wirings become shorter, and delay is reduced.

In one embodiment, each of the first local bit line sub-decoding unit 31 and the second local bit line sub-decoding unit 32 has a plurality of first transmission terminals, and each of the first transmission terminals is electrically connected to one of the bit lines through a first silicon via or a pair of first bonding pads.

In one embodiment, each of the first word line decoding unit 41 and the second word line decoding unit 42 has a plurality of second transmission terminals, and each of the second transmission terminals is electrically connected to a second silicon via or a pair of second transmission bonding pads.

In one embodiment, the first chip 100 includes a first bonding layer, and the first bonding layer includes at least one first bonding pad and/or at least one second bonding pad. The second chip 200 includes a second bonding pad layer, and the second bonding layer includes at least one first bonding pad and/or at least one second bonding pad. The first bonding pad located on the first bonding layer is bonded to the first bonding pad located on the second bonding layer, and/or, the second bonding pad located on the first bonding layer is bonded to the second bonding pad located on the second bonding layer.

Figure 6:
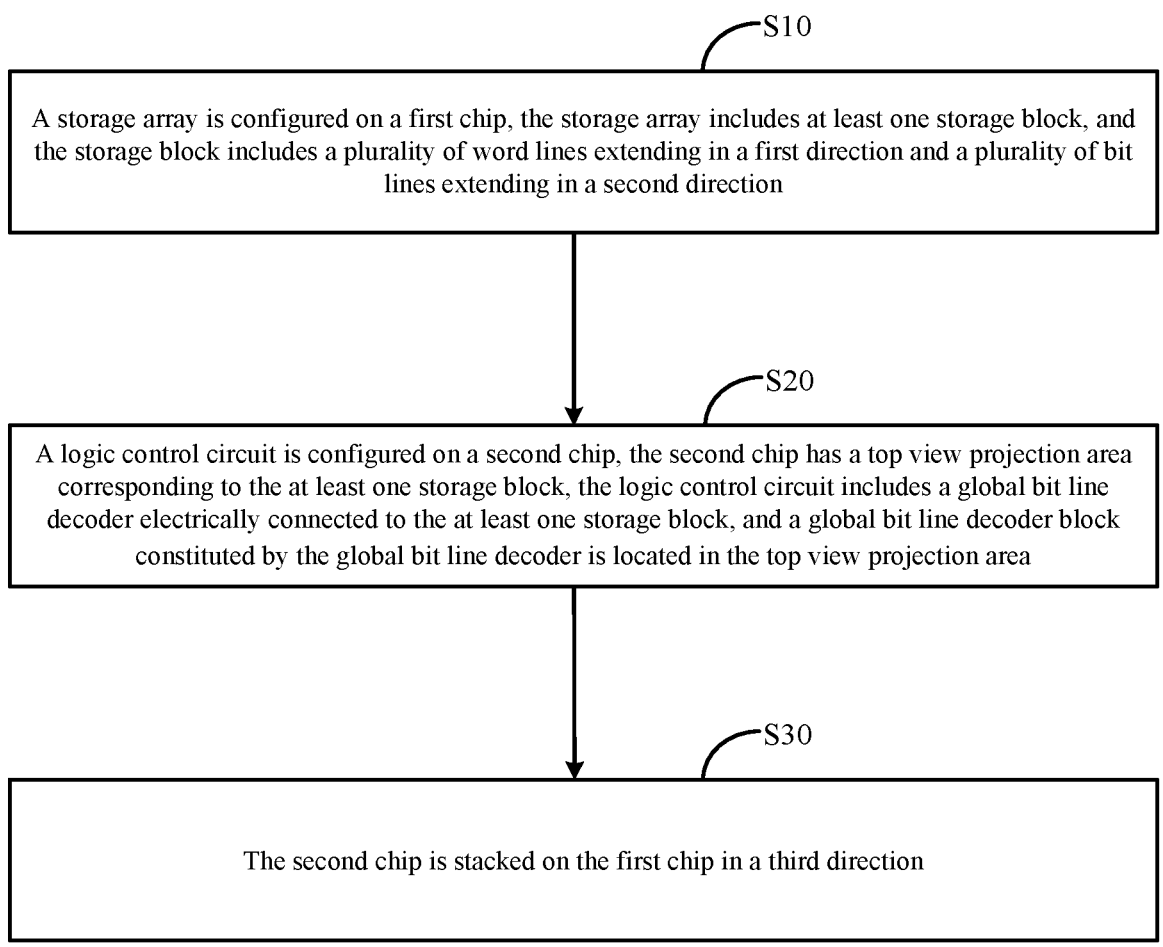
FIG. 6 illustrates a flowchart of a manufacturing method of a storage device provided by an embodiment of the present disclosure.

As shown in FIG. 6, in one embodiment, the present embodiment provides a manufacturing method of a storage device which includes the following steps.

In step S10, a storage array is configured on a first chip, the storage array includes at least one storage block, and the storage block includes a plurality of word lines extending in a first direction and a plurality of bit lines extending in a second direction.

In step S20, a logic control circuit is configured on a second chip, the second chip has a top view projection area corresponding to the at least one storage block, the logic control circuit includes a global bit line decoder electrically connected to the at least one storage block, and a global bit line decoder block constituted by the global bit line decoder is located in the top view projection area.

In step S30, the second chip is stacked on the first chip in a third direction.

It can be understood that in the manufacturing method of the storage device provided by the present embodiment, an occupied area after the first chip and the second chip are stacked can be reduced by constructing the global bit line decoder block constituted by the global bit line decoder in the top view projection area of the second chip, thereby reducing plane occupied space of the storage device. This is beneficial for minimizing the size of the storage device.

In one embodiment, the manufacturing method further includes: configuring a local bit line decoder in the logic control circuit, wherein the local bit line decoder includes a first local bit line sub-decoder; electrically connecting the first local bit line sub-decoder with the bit lines and the global bit line decoder; and configuring a first local bit line sub-decoder block constituted by the first local bit line sub-decoder to be located in the top view projection area, wherein in the first direction, a projection of the first local bit line sub-decoder block and a projection of the global bit line decoder block do not overlap with each other.

It should be noted that in the first direction, the projection of the first local bit line sub-decoder block and the projection of the global bit line decoder block do not overlap with each other. It means that in the first direction, the first local bit line sub-decoder block can have a projection of the first local bit line sub-decoder block, and the global bit line decoder block can have a projection of the global bit line decoding block. Furthermore, in the first direction, the projection of the first local bit line sub-decoder block and the projection of the global bit line decoder block do not overlap with each other on any one plane perpendicular to the first direction.

In one embodiment, the manufacturing method further includes: configuring the first local bit line sub-decoder to include a first local bit line sub-decoding unit and a second local bit line sub-decoding unit; electrically connecting the first local bit line sub-decoding unit with a part of the bit lines and the global bit line decoder, and electrically connecting the second local bit line sub-decoding unit with the other part of the bit lines and the global bit line decoder; and configuring a first local bit line sub-decoding unit block constituted by the first local bit line sub-decoding unit and a second local bit line sub-decoding unit block constituted by the second local bit line sub-decoding unit in the top view projection area, wherein in the first direction, a projection of the first local bit line sub-decoding unit block and a projection of the second local bit line sub-decoding unit block do not overlap with each other; and in the second direction, the global bit line decoder block is located between the first local bit line sub-decoding unit block and the second local bit line sub-decoding unit block.

In one embodiment, the manufacturing method further includes: configuring a word line decoding circuit in the logic control circuit, wherein the word line decoding circuit includes a first word line sub-decoder; electrically connecting the first word line sub-decoder with the word lines; and configuring a first word line sub-decoder block constituted by the first word line sub-decoder in the top view projection area, wherein in the second direction, the first word line sub-decoder block is located between the global bit line decoder block and the first local bit line sub-decoding unit block.

In one embodiment, the manufacturing method further includes: configuring the first word line sub-decoder to include a first word line decoding unit and a second word line decoding unit; electrically connecting the first word line decoding unit with a part of the word lines, and electrically connecting the second word line decoding unit with the other part of the word lines; and configuring a projection of the first word line decoding unit block constituted by the first word line decoding unit block and a projection of the second word line decoding unit block constituted by the second word line decoding units to at least partially overlap in the first direction, wherein the projection of the first word line decoding unit block and the projection of the second word line decoding unit block do not overlap with each other in the second direction.

It should be noted that the projection of the first word line decoding unit block and the projection of the second word line decoding unit block do not overlap each other in the second direction. It means that in the second direction, the first word line decoding unit block can have a projection of the first word line decoding unit block, and the second word line decoding unit block can have a projection of the second word line decoding unit block. In the second direction, the projection of the first word line decoding unit block and the projection of the second word line decoding unit block do not overlap with each other on any one plane perpendicular to the second direction.

In the above-mentioned embodiments, descriptions for the embodiments emphasize different aspects, and for a part without being described in detail in a certain embodiment, reference may be made to related descriptions in other embodiments.

The storage device and the manufacturing method thereof provided by the embodiments of the present disclosure are described in detail above. Specific examples are used in the specification to explain the principles and implementation manners of the present disclosure. The descriptions of the above-mentioned embodiments are only used to facilitate understanding of the technical solutions and core ideas of the present disclosure. Those skilled in the art should understand that they may still make modifications to the technical solutions described in the above-mentioned embodiments or make equivalent replacements to some technical features thereof. These modifications or equivalent replacements do not depart from the spirit and scope of the technical solutions of the embodiments of the present disclosure.

What is claimed is:

1. A storage device, comprising:
    a first chip, the first chip comprising a storage array, the storage array comprising at least one storage block, and the storage block comprising a plurality of word lines extending in a first direction and a plurality of bit lines extending in a second direction; and
    a second chip stacked on the first chip in a third direction, the second chip having a top view projection area corresponding to the storage block, the second chip comprising a logic control circuit, the logic control circuit comprising a global bit line decoder, the global bit line decoder electrically connected to the at least one storage block, and a global bit line decoder block constituted by the global bit line decoder being located in the top view projection area;
    wherein the logic control circuit further comprises:
    a local bit line decoder, the local bit line decoder comprising a first local bit line sub-decoder, the first local bit line sub-decoder electrically connected to the storage block and the global bit line decoder, and a first local bit line sub-decoder block constituted by the first local bit line sub-decoder located in the top view projection area; and
    wherein in the first direction, a projection of the first local bit line sub-decoder block and a projection of the global bit line decoder block do not overlap with each other.

2. The storage device of claim 1, wherein the first local bit line sub-decoding unit comprises:
    a first local bit line sub-decoding unit electrically connected to a part of the bit lines and the global bit line decoder; and
    a second local bit line sub-decoding unit electrically connected to the other part of the bit lines and the global bit line decoder;
    wherein in the direction, a projection of a first local bit line sub-decoding unit block constituted by the first local bit line sub-decoding unit and a projection of a second local bit line sub-decoding unit block constituted by the second local bit line sub-decoding unit do not overlap with each other; and in the second direction, the global bit line decoder block is located between the first local bit line sub-decoding unit block and the second local bit line sub-decoding unit block.

3. The storage device of claim 2, wherein in the first direction, a length of the global bit line decoder block, a length of the first local bit line sub-decoding unit block, and a length of the second local bit line sub-decoding unit block are smaller than or equal to a length of the top view projection area; and in the second direction, a sum of a width of the global bit line decoder block, a width of the first local bit line sub-decoding unit block, and a width of the second local bit line sub-decoding unit block is smaller than or equal to a width of the top view projection area.

4. The storage device of claim 3, wherein the logic control circuit further comprises:

a word line decoding circuit, the word line decoding circuit comprising a first word line sub-decoder, the first word line sub-decoder electrically connected to the word lines, and a first word line sub-decoder block constituted by the first word line sub-decoder located in the top view projection area;

wherein in the second direction, the first word line sub-decoder block is located between the global bit line decoder block and the first local bit line sub-decoding unit block.

5. The storage device of claim 4, wherein the first word line sub-decoder comprises:

a first word line decoding unit electrically connected to a part of the word lines; and a second word line decoding unit electrically connected to the other part of the word lines;

wherein in the first direction, a projection of the first word line decoding unit block constituted by the first word line decoding unit at least partially overlaps with a projection of a second word line decoding unit block constituted by the second word line decoding unit; and in the second direction, the projection of the first word line decoding unit block and the projection of the second word line decoding unit block do not overlap with each other.

6. The storage device of claim 5, wherein the logic control circuit further comprises:

a sense amplifying circuit electrically connected to the global bit line decoder, and a sense amplifying circuit block constituted by the sense amplifying circuit located in the top view projection area;

wherein in the first direction, the sense amplifier circuit block is located between the first word line decoding unit block and the second word line decoding unit block; and in the second direction, the sense amplifier circuit block is located between the global bit line decoder block and the second local bit line sub-decoding unit block.

7. The storage device of claim 6, wherein the sense amplifying circuit comprises:

a first group of sense amplifiers electrically connected to the global bit line decoder, and the first group of sense amplifiers comprising a plurality of sense amplifiers arranged sequentially in the first direction; and a second group of sense amplifiers electrically connected to the global bit line decoder, and the second group of sense amplifiers comprising a plurality of sense amplifiers arranged sequentially in the first direction;

wherein in the first direction, projections of a first group of sense amplifier blocks constituted by the first group of sense amplifiers and projections of second group of sense amplifier blocks constituted by the second group of sense amplifiers at least partially overlap with each other; and in the second direction, the projections of the first group of sense amplifier blocks and the projections of the second group of sense amplifier blocks do not overlap with each other.

8. The storage device of claim 7, wherein in the first direction, the first word line decoding unit block, the first group of sense amplifier blocks, the second group of sense amplifier blocks, and the second word line decoding unit block are arranged sequentially; and in the first direction, a distance between the first group of sense amplifier blocks and the first word line decoding unit block is smaller than a distance between the first group of sense amplifier blocks and the second word line decoding unit block, and a distance between the second group of sense amplifier blocks and the first word line decoding unit block is greater than a distance between the second group of sense amplifier blocks and the second word line decoding unit block.

9. The storage device of claim 7, wherein in the first direction, the projections of the first group of sense amplifier blocks and at least one of the projection of the first word line decoding unit block and the projection of the second word line decoding unit block coincide with each other, and the projections of the second group of sense amplifier blocks and at least one of the projection of the first word line decoding unit block and the projection of the second word line decoding unit block coincide with each other.

10. The storage device of claim 7, wherein the logic control circuit further comprises:

a plurality of first wirings electrically connected to output terminals of the global bit line decoder and input terminals of the sense amplifiers;

wherein in the second direction, the first wirings are located between the global bit line decoder block and the sense amplifier circuit block, and the first wirings are arranged sequentially in the first direction.

11. The storage device of claim 10, wherein the logic control circuit further comprises:

a plurality of second wirings electrically connected to input terminals of the global bit line decoder and output terminals of the local bit line decoder;

wherein in the first direction, the second wirings are arranged sequentially, and the second wirings are located in the top view projection area.

12. The storage device of claim 5, wherein each of the first local bit line sub-decoding unit and the second local bit line sub-decoding unit has a plurality of first transmission terminals, and each of the first transmission terminals is electrically connected to one of the bit lines through a first silicon via or a pair of first bonding pads; and each of the first word line decoding unit and the second word line decoding unit has a plurality of second transmission terminals, and each of the second transmission terminals is electrically connected to a second silicon via or a pair of second transmission bonding pads.

13. The storage device of claim 1, wherein the at least one storage block comprises a first storage block to an Nth storage block sequentially arranged in the second direction;

when N is an odd number, the global bit line decoder block is located in a top view projection area of a (N+1)/2 storage block in the second chip; and when N is an even number, the global bit line decoder block is located in a top view projection area of a (N/2)th storage block in the second chip or in a top view projection area of a (1+N/2)th storage block in the second chip, wherein N is an integer greater than or equal to 1.

14. A manufacturing method of a storage device, comprising:
configuring a storage array on a first chip, wherein the storage array comprises at least one storage block, and the storage block comprises a plurality of word lines extending in a first direction and a plurality of bit lines extending in a second direction;
configuring a logic control circuit on a second chip, wherein the second chip has a top view projection area corresponding to the at least one storage block, the logic control circuit includes a global bit line decoder electrically connected to the at least one storage block, and a global bit line decoder block constituted by the global bit line decoder is located in the top view projection area; and
stacking the second chip on the first chip in a third direction.

15. The manufacturing method of claim 14, further comprising:
configuring a local bit line decoder in the logic control circuit, wherein the local bit line decoder comprises a first local bit line sub-decoder;
electrically connecting the first local bit line sub-decoder with the bit lines and the global bit line decoder; and
configuring a first local bit line sub-decoder block constituted by the first local bit line sub-decoder to be located in the top view projection area, wherein in the first direction, a projection of the first local bit line sub-decoder block and a projection of the global bit line decoder block do not overlap with each other.

16. The manufacturing method of claim 15, wherein the manufacturing method further comprises:
configuring the first local bit line sub-decoder to include a first local bit line sub-decoding unit and a second local bit line sub-decoding unit;
electrically connecting the first local bit line sub-decoding unit with a part of the bit lines and the global bit line decoder, and electrically connecting the second local bit line sub-decoding unit with the other part of the bit lines and the global bit line decoder; and
configuring a first local bit line sub-decoding unit block constituted by the first local bit line sub-decoding unit and a second local bit line sub-decoding unit block constituted by the second local bit line sub-decoding unit in the top view projection area;
wherein in the first direction, a projection of the first local bit line sub-decoding unit block and a projection of the second local bit line sub-decoding unit block do not overlap with each other; and
in the second direction, the global bit line decoder block is located between the first local bit line sub-decoding unit block and the second local bit line sub-decoding unit block.

17. The manufacturing method of claim 16, further comprising:
configuring a word line decoding circuit in the logic control circuit, wherein the word line decoding circuit comprises a first word line sub-decoder;
electrically connecting the first word line sub-decoder with the word lines; and
configuring a first word line sub-decoder block constituted by the first word line sub-decoder in the top view projection area;
wherein in the second direction, the first word line sub-decoder block is located between the global bit line decoder block and the first local bit line sub-decoding unit block.

18. The manufacturing method of claim 17, further comprising:
configuring the first word line sub-decoder to include a first word line decoding unit and a second word line decoding unit;
electrically connecting the first word line decoding unit with a part of the word lines, and electrically connecting the second word line decoding unit with the other part of the word lines; and
configuring a projection of the first word line decoding unit block constituted by the first word line decoding unit block and a projection of the second word line decoding unit block constituted by the second word line decoding units to at least partially overlap in the first direction, wherein the projection of the first word line decoding unit block and the projection of the second word line decoding unit block do not overlap with each other in the second direction.

19. A storage device, comprising:
a first chip, the first chip comprising a storage array, the storage array comprising at least one storage block, and the storage block comprising a plurality of word lines extending in a first direction and a plurality of bit lines extending in a second direction; and
a second chip stacked on the first chip in a third direction, the second chip having a top view projection area corresponding to the storage block, the second chip comprising a logic control circuit, the logic control circuit comprising a global bit line decoder, the global bit line decoder electrically connected to the at least one storage block, and a global bit line decoder block constituted by the global bit line decoder being located in the top view projection area;
wherein the at least one storage block comprises a first storage block to an Nth storage block sequentially arranged in the second direction;
when N is an odd number, the global bit line decoder block is located in a top view projection area of a (N+1)/2 storage block in the second chip; and
when N is an even number, the global bit line decoder block is located in a top view projection area of a (N/2)th storage block in the second chip or in a top view projection area of a (1+N/2)th storage block in the second chip, wherein N is an integer greater than or equal to 1.

20. The storage device of claim 19, wherein the storage array comprises a plurality of storage blocks, the logic control circuit further comprises a local bit line decoder, the local bit line decoder comprises a plurality of local bit line sub-decoders, each of the local bit line sub-decoders is electrically connected to one of the storage blocks and the global bit line decoder, and a local bit line sub-decoder block constituted by each of the local bit line sub-decoders is located in the top view projection area; and
wherein in the first direction, projections of the local bit line sub-decoder blocks and a projection of the global bit line decoder block do not overlap with each other.

* * * * *